(12) United States Patent
Bauer et al.

(10) Patent No.: US 10,593,749 B2
(45) Date of Patent: Mar. 17, 2020

(54) AREA EFFICIENT FLOATING FIELD RING TERMINATION

(71) Applicant: ABB Schweiz AG, Baden (CH)

(72) Inventors: Friedhelm Bauer, Semione (CH); Umamaheswara Vemulapati, Wettingen (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/991,240

(22) Filed: May 29, 2018

(65) Prior Publication Data

US 2019/0035884 A1    Jan. 31, 2019

Related U.S. Application Data

(63) Continuation of application No. PCT/EP2016/072401, filed on Sep. 21, 2016.

(30) Foreign Application Priority Data

Nov. 27, 2015 (EP) ................................... 15196659

(51) Int. Cl.
*H01L 29/06* (2006.01)
*H01L 29/16* (2006.01)
(Continued)

(52) U.S. Cl.
CPC ...... *H01L 29/0619* (2013.01); *H01L 29/1608* (2013.01); *H01L 29/36* (2013.01);
(Continued)

(58) Field of Classification Search
None
See application file for complete search history.

(56) References Cited

U.S. PATENT DOCUMENTS 5,075,739 A    12/1991 Davies
5,345,101 A     9/1994 Tu
(Continued)

OTHER PUBLICATIONS

European Patent Office, International Search Report & Written Opinion issued in corresponding Application No. PCT/EP2016/072401, dated Dec. 21, 2016, 13 pp.
(Continued)

*Primary Examiner* — Charles D Garber
*Assistant Examiner* — Xiaoming Liu
(74) *Attorney, Agent, or Firm* — Taft, Stettinius & Hollister LLP; J. Bruce Schelkopf

(57) ABSTRACT

A high power semiconductor device with a floating field ring termination includes a wafer, wherein a plurality of floating field rings is formed in an edge termination region adjacent to a first main side surface of the wafer. At least in the termination region a drift layer, in which the floating field rings are formed, includes a surface layer and a bulk layer wherein the surface layer is formed adjacent to the first main side surface to separate the bulk layer from the first main side surface and has an average doping concentration which is less than 50% of the minimum doping concentration of the bulk layer. The drift layer includes a plurality of enhanced doping regions, wherein each one of the enhanced doping regions is in direct contact with a corresponding one of the floating field rings at least on a lateral side of this floating field ring, which faces towards the active region. The relatively low doped surface layer and the enhanced doping regions increase the electric field coupling from floating field ring to floating field ring, thus allowing an area efficient termination structure. Each enhanced doping region extends to at least the same depth as the one of the corresponding floating field ring.

19 Claims, 7 Drawing Sheets

(51) Int. Cl.
  *H01L 29/36* (2006.01)
  *H01L 29/861* (2006.01)
  *H01L 29/739* (2006.01)
  *H01L 29/808* (2006.01)
  *H01L 29/20* (2006.01)
  *H01L 29/868* (2006.01)

(52) U.S. Cl.
  CPC ...... *H01L 29/8611* (2013.01); *H01L 29/2003* (2013.01); *H01L 29/7395* (2013.01); *H01L 29/8083* (2013.01); *H01L 29/868* (2013.01)

(56) References Cited

U.S. PATENT DOCUMENTS

| | | | |
|---|---|---|---|
| 6,445,054 | B1 | 9/2002 | Traijkovic et al. |
| 2009/0072340 | A1* | 3/2009 | Zhang ............... H01L 21/761 257/490 |
| 2014/0252553 | A1 | 9/2014 | Liao |
| 2015/0050798 | A1* | 2/2015 | Kobayashi ......... H01L 29/7397 438/475 |
| 2015/0318347 | A1* | 11/2015 | Falck ................ H01L 29/0623 257/170 |

OTHER PUBLICATIONS

European Patent Office, Extended Search Report issued in corresponding Application No. 15196659.5, dated May 25, 2016, 8 pp.
Vellvehi et al., "Design and optimisation of suitable edge terminations for 6.5 kV IGBTs," Microelectronics Journal 33, 2002, pp. 765-769.
ABB Schweiz AG, Letter Making Amendments at Entry into European Phase submitted to European Patent Office on Jan. 24, 2017 in corresponding Application No. PCT/EP2016/072401, 2 pp.

* cited by examiner

AREA EFFICIENT FLOATING FIELD RING TERMINATION

FIELD OF THE INVENTION

The present invention relates to a high power semiconductor device comprising a planar high voltage edge termination structure and in particular to a high power semiconductor device comprising a floating field ring (FFR) termination (also called guard ring termination) in a termination region laterally surrounding the active region of a wafer.

BACKGROUND OF THE INVENTION

Semiconductor devices, in particular high power semiconductor devices, require an efficient edge termination to avoid electric field crowding at the edge of the main contact resulting in breakdown of the device at a relatively low breakdown voltage VBR. Common power semiconductor devices, such as a pin diode or an insulated-gate bipolar transistor (IGBT), require a means of planar edge termination in order to achieve a breakdown voltage in the range of 80 to 90% of the ideal one-dimensional diode breakdown voltage.

For silicon-based devices known planar edge termination techniques include junction termination extension (JTE), variation of lateral doping (VLD) and floating field ring terminations (FFR) with and without field plate extensions. Etched and refilled trenches have also been used. Silicon carbide (SiC) and especially 4H-SiC is an attractive material for high power semiconductor devices due to its ten times higher critical electrical field than that of silicon. Given the well-known restrictions with SiC process technology, there are significant constraints for forming planar edge terminations in SiC-based high power semiconductor devices. For example, when planar junctions are to be formed in SiC by implantation the junction depth is limited to about 2 µm.

Floating field rings and the junction termination extension are the most commonly used edge termination techniques in 4H-SiC based high power devices. The floating field ring termination structure has the advantage that the generation of floating field rings can be easily integrated in the manufacturing process since the floating field rings can be formed simultaneously with a main junction. Accordingly, it is possible to form the floating field rings without having to increase the necessary number of masks. On the other hand, the design of a high performance floating field ring termination is very challenging given the high number of factors affecting the most important trade-off between breakdown voltage and occupied wafer area. This trade-off is strongly affected by interface trapped charges (technology impact) and by design parameters, such as the lateral width and depth of the floating field rings or the distance between two neighbouring floating field rings.

The purpose of the floating field ring termination structure is to alleviate the field crowding effect at the outer edges of the device main junction by allowing the depletion region to extend through consecutively lower biased floating junctions. To be effective, the distances between these floating field rings as well as their width in the lateral direction have to be thoroughly optimized to achieve an even distribution of the electric field. In addition, the effect of the floating field ring termination structure is very sensitive to the influence of parasitic surface charges which inherently result from the processing conditions during the manufacturing process for a high power semiconductor device.

Floating field ring termination systems are in use for low and medium voltage components (600 V to 3.3 kV IGBTs, for example). For these voltage classes, appropriate breakdown voltages can be achieved with 3 to 15 floating field rings. For even higher voltages, the number of floating field rings required to reach 6 to 10 kV blocking capability will reach 30 to 50 resulting in a reduced wafer area being available for the active area. To attain a high current handling capability the active area should be as large as possible. Therefore, the area efficiency of a planar edge termination structure is of utmost importance for the current handling capability of a high power semiconductor device having a planar edge termination structure. Due to the high number of required floating rings this a particular critical aspect especially for high voltage devices employing a floating field ring structure.

In prior art document U.S. Pat. No. 5,075,739 A there is described a high voltage planar edge termination structure comprising a plurality of guard rings. To increase the punch-trough breakdown voltage between the guard rings there is provided an enhancement region formed in the separation region between two neighbouring guard rings which connects these two neighbouring guard rings with each other, respectively. The enhancement region has a conductivity type which is different from that of the guard rings and has a doping concentration higher than that of the semiconductor substrate in which the guard rings are formed. The enhancement region allows two neighbouring guard rings to be disposed more close to each other and to thereby improve the area efficiency.

From the prior art document U.S. Pat. No. 6,445,054 B1 there is known a high power semiconductor device having a planar edge termination structure comprising $p^+$ floating rings formed in an $n^-$ drift layer, the $p^+$ floating rings surrounding an active area of the high power semiconductor device. The floating field rings are formed just below a passivation layer in the form of a surface field oxide layer. Respective additional n and p shallow rings are formed on opposite sides of each one of the main $p^+$ floating rings to overcome the problem of severe deterioration of the device's breakdown characteristic, when there was either negative or positive charge in the surface field oxide layer. The additional n and p shallow rings have a lower doping concentration than that of the $p^+$ floating rings, but have a higher doping concentration than that of the $n^-$ drift layer.

From the prior art document US 2014/252553 A1 there is known a MOSFET having a p-base layer, floating field rings covered with a field oxide layer and an n-drift layer. The floating field rings are embedded in a lowly or non-doped layer.

SUMMARY OF THE INVENTION

It is the object of the invention to provide a high power semiconductor device with an area efficient floating field ring termination structure exhibiting a high breakdown voltage.

The object of the invention is attained by a high power semiconductor device according to claim 1. The relatively low doped surface layer with the reduced doping concentration greatly enhances the electric field coupling from floating field ring to floating field ring, thus making it possible that the design of a field floating ring termination structure has strongly reduced area requirements for a specific breakdown voltage since the enhanced electric field coupling allows a reduced separation distance between neighbouring floating field rings, respectively. This is of particular advantage in SiC-based devices considering the comparatively small size of the available SiC wafers or dies. The enhanced doping regions have the effect of further increasing the electric field coupling from floating field ring to floating field ring. Moreover the enhanced doping regions respectively act as an electric field stop region allowing a higher electric field close to the blocking pn-junction to achieve a compact, area saving field ring termination.

Further developments of the invention are specified in the dependent claims.

In an exemplary embodiment the average doping concentration of the surface layer is less than 30% of the minimum doping concentration of the bulk layer, more exemplarily less than 20% of the minimum doping concentration of the bulk layer. Such low average doping concentration can further enhance the electric field coupling from floating field ring to floating field ring, thus allowing further reduced area requirements of the floating field ring termination structure for a specific breakdown voltage.

In an exemplary embodiment the doping profile in a transition region at the interface between the surface layer and the bulk layer is step-like with a steep gradient of the doping concentration, which increases in the transition region by at least 100% from the surface layer to the bulk layer, wherein the transition region has a thickness of less than 0.1 µm.

In an exemplary embodiment the surface layer extends from the first main side surface to a depth which is at least 80% of the depth of the floating field rings. Such depth of the surface layer ensures a high electric field coupling from floating field ring to floating field ring, thus allowing a particular area efficient floating field ring termination structure. Exemplarily the surface layer extends from the first main side surface to a depth which is at least the same as that of the floating field rings or is more than that of the floating field rings so that the floating field rings are embedded in the surface layer. In case that the floating field rings are embedded in the surface layer the electric field coupling can efficiently reach around floating field rings.

In an exemplary embodiment, the minimum doping concentration of the bulk layer is below $5 \cdot 10^{15}$ cm$^{-3}$. Throughout this specification the term doping concentration refers to the net doping concentration.

In an exemplary embodiment the peak doping concentration of each one of the enhanced doping regions is in a range between $1 \cdot 10^{16}$ cm$^{-3}$ and $1 \cdot 10^{18}$ cm$^{-3}$.

In an exemplary embodiment each one of the floating field rings is in direct contact with a corresponding one of the enhanced doping regions.

In an exemplary embodiment each one of the enhanced doping regions extends from the first main side surface to a depth which is at least the depth of the corresponding floating field ring. Such depth of the enhanced doping region is particular efficient to enhance the electric field coupling from floating field ring to floating field ring. Also, the deep enhanced doping region functions as an effective field stop region such that punch-through breakdown is efficiently avoided to allow to further decrease the separation distance between floating field rings, thus allowing a particular area efficient floating field ring termination structure.

In an exemplary embodiment each one of the enhanced doping regions envelops at least a part of a bottom surface of the corresponding floating field ring. Such configuration can further enhance the electric field coupling from floating field ring to floating field ring, thus allowing a more area efficient floating field ring termination structure.

In an exemplary embodiment each one of the enhanced doping regions has a lateral width in a plane parallel and adjacent to the first main side surface, which is smaller than the lateral width of a neighbouring floating field ring in the plane parallel and adjacent to the first main side surface. "Lateral width" shall mean the width of a region in a plane parallel to the first main side surface 2 in a direction perpendicular to an envelope of the active region, which is a direction in which subsequent floating rings 10 have the smallest distance from each other. For each one of the enhanced doping regions except an enhanced doping region next to the active region, this lateral width is smaller than the distance between this enhanced doping region and the next floating field region separated from this enhanced doping region by the surface layer in a direction towards the active region. For the enhanced doping region next to the active region, the lateral width is smaller than the distance between this enhanced doping region and the first semiconductor layer separated from this enhanced doping region by the surface layer in the direction towards the active region. A small width of the enhanced doping region can further reduce the separation distance between the floating field rings, thus allowing a more area efficient floating field ring termination structure.

In an exemplary embodiment the high power semiconductor device comprises a plurality of extension regions, each extension region being formed as a third ring-shaped semiconductor region of the first conductivity type having a peak doping concentration lower than that of the floating field rings, each one of extension regions being formed on the lateral side of a corresponding floating ring to surround the corresponding floating field ring and to be in direct contact with the corresponding floating field ring, each one of the extension regions extending from the first main side surface to a depth which is deeper than the depth of the corresponding floating field ring. The extension regions reduce the electric field peak which can be observed at the pn-junction on the lateral side of the floating field ring facing away from the active region.

In an exemplary embodiment the first to third semiconductor layers and the floating field rings are made of SiC. In SiC-based devices area efficiency of the edge termination structure is of particular importance.

In an exemplary embodiment the surface layer separates the bulk layer from the first main side surface at least in an area between an innermost floating field ring and the active area and between each pair of neighbouring floating field rings.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF PREFERRED EMBODIMENTS

Figure 1:
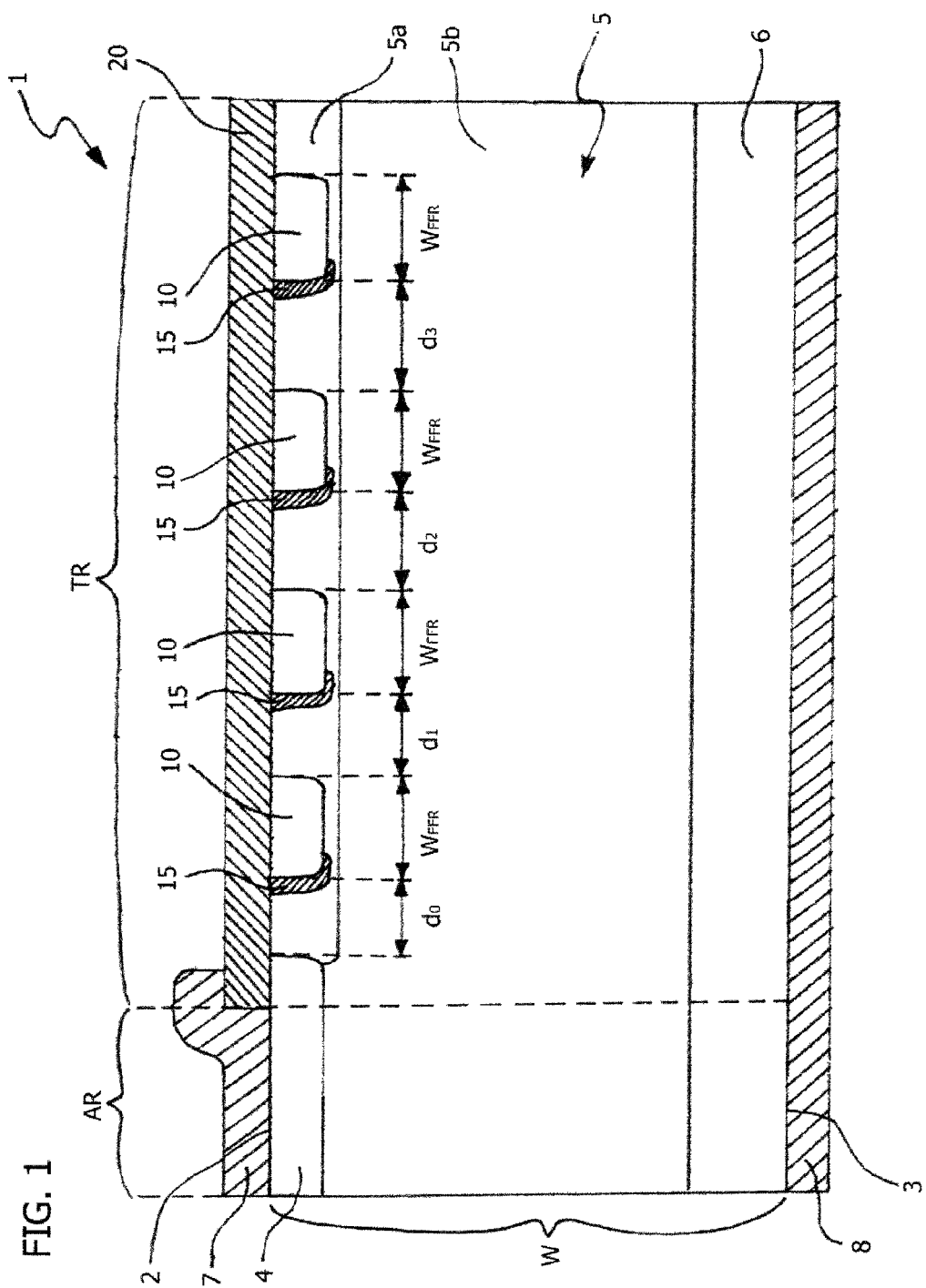
FIG. 1 is a partial cross-sectional view of a high power semiconductor device according to a first embodiment.

FIG. 1 is a partial cross-sectional view of a high power semiconductor device 1 according to a first embodiment. The high power semiconductor device 1 is a silicon carbide (SiC) based pin diode. It comprises a 4H-SiC wafer W having a first main side surface 2 and a second main side surface 3, which is parallel to the first main side surface 2 and extending in a lateral direction. The wafer W has an active region AR and a termination region TR laterally surrounding the active region AR. In the order from the first main side surface 2 to the second main side surface 3, the wafer W comprises a p-doped anode layer 4 (first semiconductor layer in the claims), an n-doped drift layer 5 (second semiconductor layer in the claims), and an n$^+$-doped substrate layer 6 (third semiconductor layer in the claims) having a doping concentration higher than that of the n-doped drift layer 5. Exemplarily the doping concentration of the substrate layer is $5 \cdot 10^{18}$ cm$^{-3}$ or more. The doping concentration of the anode layer 4 is exemplarily $5 \cdot 10^{16}$ cm$^{-3}$ or more. The drift layer 5 is in direct contact with the anode layer 4 to form a main pn-junction (first pn-junction in the claims). An anode electrode 7 (first electrode in the claims) is formed on the first main side surface 2 to form an ohmic contact with the anode layer 4. On the second main side surface 3 of the wafer W there is formed a cathode electrode 8 (second electrode in the claims) to form an ohmic contact with the substrate layer 6. Depending on the voltage class of the power semiconductor device the thickness of the drift layer 5 may exemplarily vary in a range between 30 to 400 µm.

A plurality of p$^+$-doped floating field rings 10 (i.e. of the first conductivity type) is formed in the termination region TR adjacent to the first main side surface 2 of the wafer W. Each one of the floating field rings 10 is ring-shaped and laterally surrounds the active region AR and the anode layer 4. The field rings 10 are self-contained rings, which enclose in a plane parallel to the first main surface 2 the active region AR and such floating rings, which are arranged closer to the active region. Also, each floating field ring 10 is in direct contact with the drift layer 5 to form a pn-junction (second pn-junction in the claims). Exemplarily, the floating field rings 10 have a peak doping concentration in a range between $1 \cdot 10^{17}$ cm$^{-3}$ and $1 \cdot 10^{19}$ cm$^{-3}$, exemplarily between $1 \cdot 10^{18}$ cm$^{-3}$ and $1 \cdot 10^{19}$ cm$^{-3}$.

As can be seen from FIG. 1, in the termination region TR the drift layer 5 comprises a surface layer 5a and a bulk layer 5b, wherein the surface layer 5a is formed adjacent to the first main side surface 2 of the wafer W to separate the bulk layer 5b from the first main side surface 2. Exemplarily the surface layer 5a separates the bulk layer 5b from the first main side surface 2 at least in an area between an innermost floating field ring and the anode layer 4, i.e. the active area AR, and between each pair of neighbouring floating field rings 10. The surface layer 5a differs from the bulk layer 5b in that it has a lower doping concentration than the bulk layer 5b. Specifically, the surface layer 5a has an average doping concentration which is less than 50% of the minimum doping concentration of the bulk layer 5b. Exemplarily, the average doping concentration of the surface layer 5a is less than 30% of the minimum doping concentration of the bulk layer 5b, more exemplarily less than 20% of the minimum doping concentration of the bulk layer 5b. Exemplarily the average doping concentration of the surface layer 5a may be in a range between 10% and 50% of the minimum doping concentration of the bulk layer 5b, more exemplarily in a range between 20% and 40%. The bulk layer 5b may have a minimum doping concentration of $1 \cdot 10^{16}$ cm$^{-3}$ or below, exemplarily of $5 \cdot 10^{15}$ cm$^{-3}$ or below, more exemplarily in a range between $1 \cdot 10^{14}$ cm$^{-3}$ and $1 \cdot 10^{16}$ cm$^{-3}$, and more exemplarily in a range between $5 \cdot 10^{14}$ cm$^{-3}$ and $5 \cdot 10^{15}$ cm$^{-3}$. The surface layer 5b may be formed by epitaxy. In this case the doping profile in a transition region at the interface between the surface layer 5a and the bulk layer 5b can be step-like with a steep gradient of the doping concentration, which increases in the transition region by at least 100% from the surface layer 5a to the bulk layer 5b, wherein the transition region has a thickness of less than 0.1 µm. In the high power semiconductor device 1 according to the first embodiment a depth $d_{SL}$ of the surface layer 5a is greater than a depth $d_{FFR}$ of the floating field rings 10. Accordingly, in the first embodiment the floating field rings 10, which have all the same depth $d_{FFR}$, are embedded in the surface layer 5a.

In the first embodiment shown in FIG. 1 the first (i.e. the innermost) floating field ring 10 is spaced from the anode layer 7 in a lateral direction by a distance $d_0$. Therein, the distance $d_0$ is the minimum distance between the anode layer 4 and the first floating field ring 10 in a plane parallel and adjacent to the first main side surface 2. The distance do is constant along the whole first floating field ring 10. In FIG. 1, the distance between the second floating field ring 10 and the first floating field ring 10 in the lateral direction is $d_1$, the distance between the third floating ring 10 and the second floating field ring 10 is $d_2$, and the distance between fourth floating field ring 10 and the third floating field ring 10 is $d_3$. The distance do is smaller than any distance $d_1$, $d_2$, $d_3$ between neighbouring floating field rings 10, and the distances $d_1$, $d_2$, $d_3$ between neighbouring floating field rings 10 increase from inside to outside (i.e. they increase with increasing distance from the active region AR). The distance do may be in a range from 20% to 60% of the maximum distance between the outermost pair of neighbouring floating field rings 10. Exemplarily the distance do is at least 2 µm, more exemplarily at least 3 µm. Neighbouring floating field rings 10 are separated from each other by the surface layer 5a and by a corresponding one of the enhanced doping regions 15. Likewise the first floating field ring 10 is separated from the anode layer 4 by the surface layer 5a and the corresponding enhanced doping region 15. A lateral width $w_{FFR}$ of the floating field rings 10 in a plane parallel and adjacent to the first main side surface 2 may be the same for all floating field rings 10 but it can also vary from ring to ring.

Figure 2:
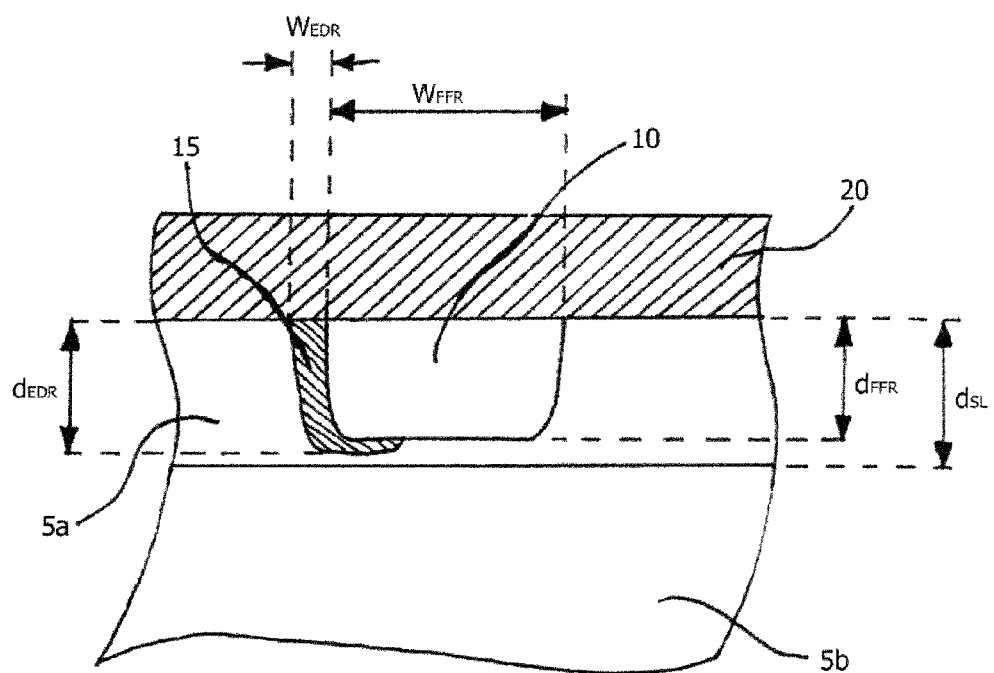
FIG. 2 is an enlarged portion of the partial cross-sectional view of FIG. 1, wherein one of the plurality of floating field rings is shown in cross-section.

In the first embodiment, the drift layer 5 further comprises a plurality of n-doped enhanced doping regions 15. Each one of the enhanced doping regions 15 is formed in the termination region TR adjacent to the first main side surface 2 of the wafer W as a ring-shaped semiconductor region, which is laterally surrounding the active region AR and the anode layer 7, wherein each one of the enhanced doping regions 15 is in direct contact with a corresponding one of the floating field rings 10 on a lateral side, which faces towards the active region AR (i.e. on the left side of the floating field rings 10 in FIGS. 1 and 2), to form a pn-junction with the corresponding one of the floating field rings 10. On the other side each one of the floating field rings 10 is in direct contact with a corresponding one of the enhanced doping regions 15.

Each one of the enhanced doping regions 15 has a peak doping concentration which is higher than the minimum doping concentration of the bulk layer 5b. Exemplarily each enhanced doping region 15 has a local doping concentration which is everywhere in the enhanced doping regions 15 higher than the minimum doping concentration of the bulk layer 5b. Exemplarily the doping concentration of the bulk layer 5b is constant and the local doping concentration of the enhanced doping regions 15 is everywhere in the enhanced doping regions 15 higher than the constant doping concentration of the bulk layer 5b. Exemplarily the peak doping concentration of each one of the enhanced doping regions 15 is in a range between $1 \cdot 10^{16}$ cm$^{-3}$ and $1 \cdot 10^{18}$ cm$^{-3}$. The enhanced doping region 15 next to the active region AR is separated by the surface layer 5a from the anode layer 4 in a direction towards the active region AR. The remaining enhanced doping regions 15 (i.e. all enhanced doping regions 15 except the one next to the active region AR) are separated by the surface layer 5a from the next floating field region 10 in a direction towards the active region AR, respectively.

Each one of the enhanced doping regions 15 envelops a part of a bottom surface of the corresponding one of the floating field rings 10. Accordingly, each one of the enhanced doping regions 15 overlaps with the corresponding one of the floating field rings 10 in an orthogonal projection onto a plane parallel to the first main side surface 2.

Each one of the enhanced doping regions 15 has a lateral width $w_{EDR}$ in a plane parallel and adjacent to the first main side surface 2, which is smaller than a lateral width $w_{FFR}$ of a neighbouring floating field ring 10 in the plane parallel and adjacent to the first main side surface 2, and which is smaller than a separation distance between this enhanced doping region 15, 15', 15'', 15''' and the next floating field region 10 or the anode layer 4 separated from this enhanced doping region 15, 15', 15'', 15''' by the surface layer 5a in a direction towards the active region AR. Therein, the separation distance between the enhanced region 15 of the first floating field ring 10 and the anode layer 4 is calculated by $d_0$-2$_{EDR}$. Likewise the separation distance between the enhanced region 15' of the second floating ring 10 and the first floating ring 10 is calculated by $d_1$-$w_{EDR}$, the separation distance between the enhanced region 15'' of the third floating ring 10 and the second floating ring 10 is calculated by $d_2$-$w_{EDR}$, and so on. Exemplarily, the lateral width $w_{EDR}$ of the enhanced doping regions 15, 15', 15'', 15''' is in a range between 0.3 µm to 3 µm, more exemplarily in a range between 0.5 and 2 µm. Exemplarily the lateral width $w_{EDR}$ of the enhanced doping region 15, 15', 15'', 15''' between two each pair of two neighbouring floating field rings 10 is less than half of the distance between these two neighbouring floating field rings 10, more exemplarily less than a third of the distance between these two neighbouring floating field rings 10.

On the termination region TR there is formed a passivation layer 20 on the first main side surface 2 of the wafer W.

The number of floating field rings 10 in the edge termination structure may vary dependent on the voltage class of the high power semiconductor device 1 and depending on the depth $d_{FFR}$ of the floating field rings 10. The total number of floating field rings 10 may be up to 200.

Figure 3:
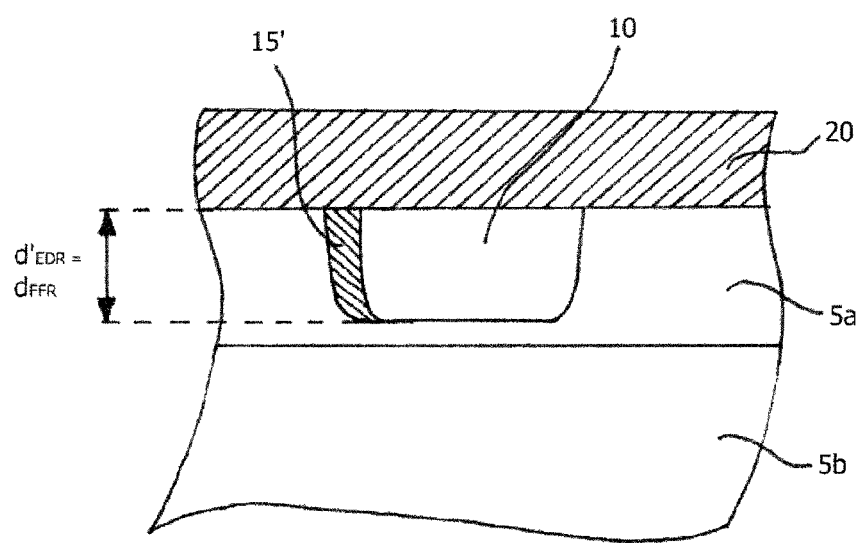
FIG. 3 is a partial cross-sectional view of a high power semiconductor device according to a second embodiment, wherein one of a plurality of floating field rings is shown in cross-section.

In the following there is explained a second embodiment of the high power semiconductor device with reference to FIG. 3. Due to the many similarities of the second embodiment with the first embodiment only differences of the second embodiment to the first embodiment are discussed. The remaining features are the same as in the first embodiment and for an explanation thereof it is referred to the first embodiment discussed above with reference to FIGS. 1 and 2. The enhanced doping regions 15' in the high power semiconductor device according to the second embodiment differ from the enhanced doping regions 15 in the first embodiment in that the enhanced doping regions 15' have a depth $d_{EDR}'$, which is identical to the depth $d_{FFR}$ of the floating field rings 10. Accordingly, in contrast to the enhanced doping regions 15 in the first embodiment, the enhanced doping regions 15' do not cover the bottom surface of the floating field rings 10, respectively.

Figure 4:
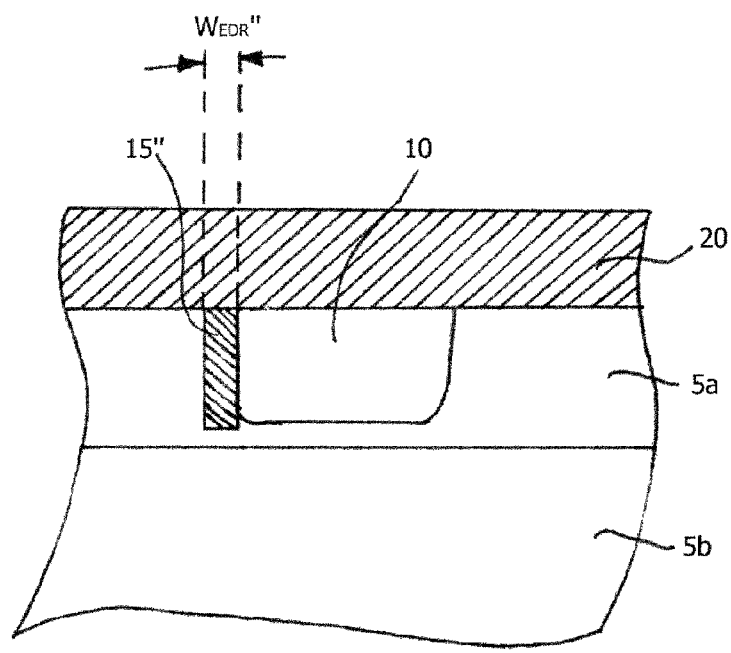
FIG. 4 is a partial cross-sectional view of a high power semiconductor device according to a third embodiment, wherein one of a plurality of floating field rings is shown in cross-section.

In the following there is explained a third embodiment of the high power semiconductor device with reference to FIG. 4. Due to the many similarities of the third embodiment with the first embodiment only differences of the third embodiment to the first embodiment are discussed. The remaining features are the same as in the first embodiment and for an explanation thereof it is referred to the first embodiment discussed above with reference to FIGS. 1 and 2. The high power semiconductor device according to the third embodiment differs from that of the first embodiment in that the doping profile in a transition region from the enhanced doping regions 15'' to the surface layer 5a and from the enhanced doping regions 15'' to the floating field rings 10 are step-like. This is attained by a manufacturing method, in which the enhanced doping regions 15'' are formed by filling a trench instead of forming the enhanced doping regions 15 by implantation or diffusion of an n-type dopant. Further, in the third embodiment the lateral width of the enhanced doping regions 15'' is substantially constant from the first main side surface to the bottom. Exemplarily, the width varies by less than 10% from the first main side surface 2 to the bottom side of the enhanced doping regions 15'' opposite to the first main side surface 2. The enhanced doping regions 15'' in the third embodiment require less area compared to the implanted/diffused enhanced doping regions 15 of the first embodiment since the abrupt doping or step-like doping profile allows to employ a relatively small lateral width $w_{EDR}''$ of the enhanced doping region 15''. Also, the abrupt step-like transition from the enhanced doping region 15'' to the p-type floating field ring 10 can further improve the electric field coupling from floating field ring 10 to floating field ring 10.

Figure 5:
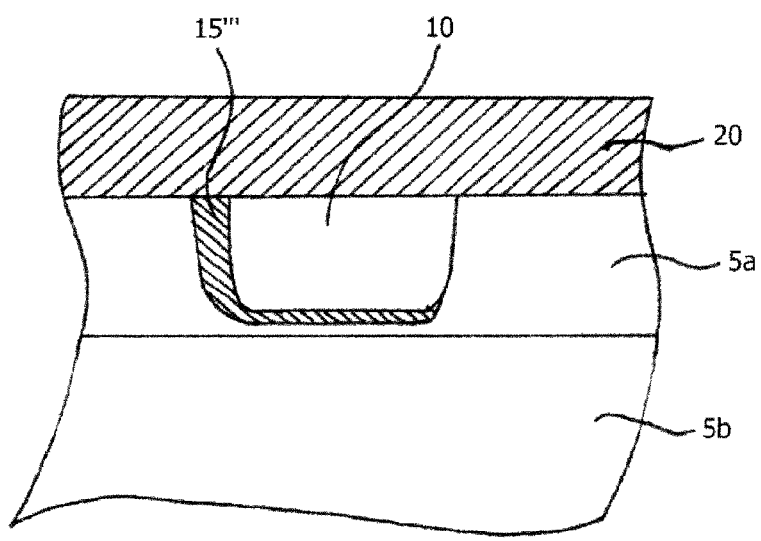
FIG. 5 is a partial cross-sectional view of a high power semiconductor device according to a fourth embodiment, wherein one of a plurality of floating field rings is shown in cross-section.

In the following there is explained a fourth embodiment of the high power semiconductor device with reference to FIG. 5. Due to the many similarities of the fourth embodiment with the first embodiment only differences of the fourth embodiment to the first embodiment are discussed. The remaining features are the same as in the first embodiment and for an explanation thereof it is referred to the first embodiment discussed above with reference to FIGS. 1 and 2. The high power semiconductor device according to the fourth embodiment differs from that of the first embodiment in that the enhanced doping regions 15''' envelop not only a (relatively small) part of a bottom surface of the corresponding one of the floating field rings 10 but a main part of or the whole bottom surface of the floating field rings 10. This can further enhance the electric field coupling from floating field ring 10 to floating field ring 10.

Figure 6:
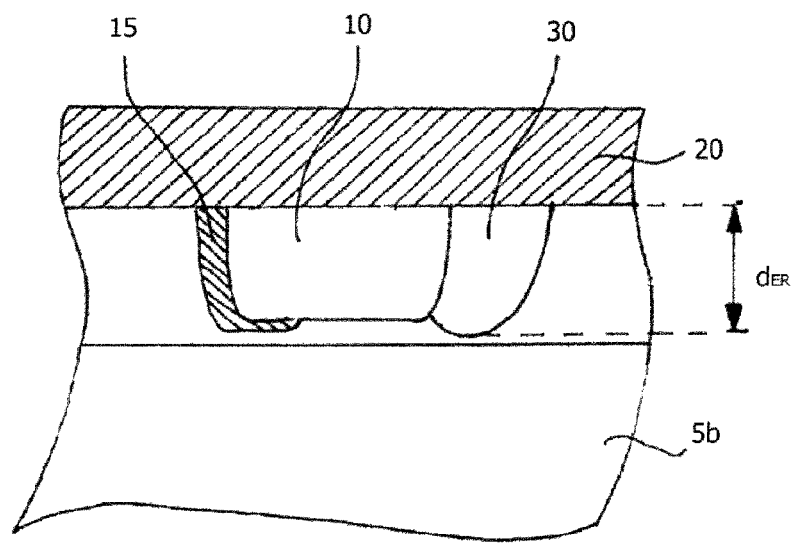
FIG. 6 is a partial cross-sectional view of a high power semiconductor device according to a fifth embodiment, wherein one of a plurality of floating field rings is shown in cross-section.

In the following there is explained a fifth embodiment of the high power semiconductor device with reference to FIG. 6. Due to the many similarities of the fifth embodiment with the first embodiment only differences of the fifth embodiment to the first embodiment are discussed. The remaining features are the same as in the first embodiment and for an explanation thereof it is referred to the first embodiment discussed above with reference to FIGS. 1 and 2. The high power semiconductor device according to the fifth embodiment differs from that of the fourth embodiment in that there is further provided a p-type extension region 30 on the lateral side of the floating field ring 10, which faces away from the active region, i.e. on a side of the floating field ring 10 opposite to the side, on which the enhanced doped region 15 is located. The extension region 30 is in direct contact with the floating ring 10 and has a doping concentration lower than that of the floating field ring 10. It extends from the first main side surface 2 to a depth $d_{ER}$, which is larger than that of the floating field ring 10. The extension region 30 has the advantageous effect that it can reduce the maximum electric field peak.

Figure 7:
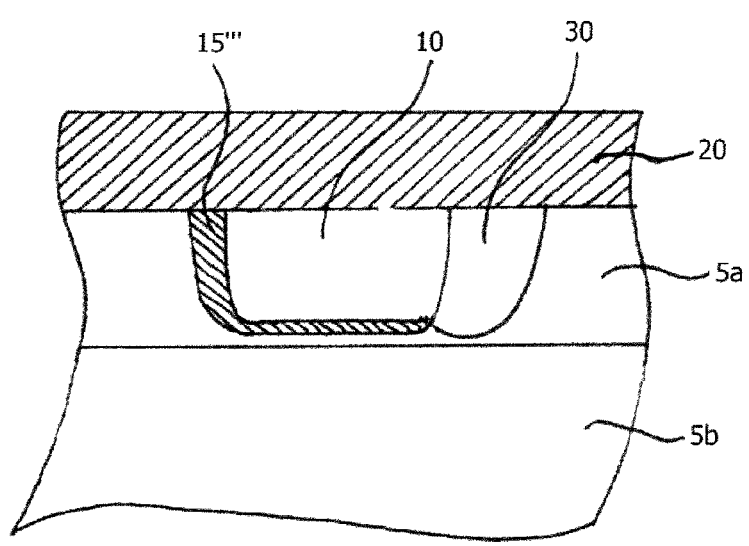
FIG. 7 is a partial cross-sectional view of a high power semiconductor device according to a sixth embodiment, wherein one of a plurality of floating field rings is shown in cross-section.

In FIG. 7 there is shown a sixth embodiment of the high power semiconductor device. It differs from the before explained fifth embodiment only in that it employs the enhanced doping regions 15''' of the fourth embodiment shown in FIG. 5.

It will be apparent for persons skilled in the art that modifications of the above described embodiments are possible without departing from the idea of the invention as defined by the appended claims.

In the above embodiments the surface layer 5a extended from the first main side surface 2 to a depth $d_{SL}$ larger than the depth $d_{FFR}$ of the floating field rings 10. In an exemplary example, which is not part of the invention, a significant improvement of the electric field coupling from floating field ring 10 to floating field ring 10 can still be achieved in case that depth $d_{SL}$ of the surface layer 5a is at least 80% of the depth $d_{FFR}$ of the floating field rings 10. Exemplarily, the surface layer 5a may extend from the first main side surface 2 to a depth $d_{SL}$ which is at least the same as a depth $d_{FFR}$ of the floating field rings 10.

In the above embodiments the material of the semiconductor wafer W, and in particular the material of the anode layer 4, the material of the drift layer 5 and the material of the substrate layer 6 was described to be 4H-SiC. However, it is also possible to use other semiconductor materials such as silicon or group-III-nitrides, such as gallium nitride or aluminum nitride. If the semiconductor material is silicon, the peak doping concentration of the enhanced doping regions is exemplarily in a range between $1 \cdot 10^{15}$ cm$^{-3}$ and $1 \cdot 10^{17}$ cm$^{-3}$.

In the above embodiments the high power semiconductor device was described to be a high power diode (pin diode). However, the described edge termination structure may be employed also for any other high power semiconductor device such as a junction gate field-effect transistor (JFET), a metal-oxide-semiconductor field-effect transistor (MOSFET), an insulated gate bipolar transistor (IGBT), a bipolar junction transistor (BJT), or a thyristor. In case of some high power semiconductor devices, such as in the case of an IGBT, the first semiconductor layer is not an anode layer as in the above explained embodiments, but a cathode layer, the first electrode is not an anode electrode as in the above explained embodiments but a cathode electrode, and the second electrode is not a cathode electrode as in the above explained embodiments but an anode electrode.

Further, some high power semiconductor devices may comprise additional semiconductor layers, such as in an IGBT, where a p+-doped substrate layer is inserted between an n+-doped buffer layer (corresponding to the third semiconductor layer in the claims) and an anode electrode (corresponding to the second electrode in the claims).

All above embodiments included the enhanced doping region 15, 15', 15'', 15''' which has the depth $d_{EDR}$, $d_{EDR}'$ which is at last as deep as the depth $d_{FFR}$ of the floating field rings 10. In an exemplary example, which is not part of the invention, an improvement of the area efficiency can also be achieved with more shallow enhanced doping regions.

The above embodiments were explained with specific conductivity types. The conductivity types of the semiconductor layers in the above described embodiments might be switched, so that all layers which were described as p-type layers would be n-type layers and all layers which were described as n-type layers would be p-type layers.

It should be noted that the term "comprising" does not exclude other elements or steps and that the indefinite article "a" or "an" does not exclude the plural. Also elements described in association with different embodiments may be combined.

LIST OF REFERENCE SIGNS 1 high power semiconductor device
2 first main side surface
3 second main side surface
4 (p-doped) anode layer
5 (n-doped) drift layer
5a surface layer
5b bulk layer
6 (n$^+$-doped) substrate layer
7 anode electrode
8 cathode electrode
10 (p$^+$-doped) floating field ring
15, 15', 15'', 15''' enhanced doping region
20 passivation layer
AR active region
$d_0$, $d_1$, $d_2$, $d_3$ distance
$d_{EDR}$, $d_{EDR}'$ depth of enhanced doping region
$d_{ER}$ depth of extension region
$d_{FFR}$ depth of floating field rings
$d_{SL}$ depth of the surface layer
TR termination region
$w_{EDR}$, $w_{EDR}''$ lateral width of enhanced doping regions
$w_{FFR}$ lateral width of the floating rings
W wafer

The invention claimed is:
1. A high power semiconductor device comprising a wafer (W), the wafer (W) having a first main side surface, a second main side surface, which is parallel to the first main side surface and extending in a lateral direction, an active region (AR) and a termination region (TR) laterally surrounding the active region (AR), wherein:
the wafer (W)-comprises in the order from the first main side surface to the second main side surface:
(a) a first semiconductor layer of a first conductivity type which is either n-type or p-type conductivity;
(b) a second semiconductor layer of a second conductivity type which is different from the first conductivity type, wherein the second semiconductor layer is in direct contact with the first semiconductor layer to form a first pn-junction; and
(c) a third semiconductor layer of the second conductivity type having a doping concentration higher than that of the second semiconductor layer,
a first electrode is formed on the first main side surface to form a first contact with the first semiconductor layer,
a second electrode is formed on the second main side surface to form a second contact,
a plurality of floating field rings is formed in the termination region (TR) adjacent to the first main side surface of the wafer (W), wherein each one of the floating field rings is a first ring-shaped semiconductor region of the first conductivity type, which is laterally surrounding the active region (AR) and the first semiconductor layer and which forms a second pn-junction with the second semiconductor layer, and wherein the floating field rings are spaced from each other in the lateral direction and are separated from each other by the second semiconductor layer,
in the termination region (TR) the second semiconductor layer comprises a surface layer and a bulk layer, wherein the surface layer is formed adjacent to the first main side surface and has an average doping concentration which is less than 50% of the minimum doping concentration of the bulk layer, wherein
the second semiconductor layer comprising a plurality of enhanced doping regions, wherein:
each one of the enhanced doping regions is formed in the termination region (TR) adjacent to the first main side surface of the wafer (W), and
each one of the enhanced doping regions is a second ring-shaped semiconductor region of the second conductivity type, which is laterally surrounding the active region (AR)-and the first semiconductor layer, wherein each one of the enhanced doping regions is in direct contact with a corresponding one of the floating field rings at least on a lateral side of this floating field ring, which faces towards the active region (AR),
each one of the enhanced doping regions has a peak doping concentration which is higher than the minimum doping concentration of the bulk layer,
each one of the enhanced doping regions except an enhanced doping region next to the active region (AR) is separated by the surface layer from the next floating field region in a direction towards the active region (AR),
the enhanced doping region next to the active region (AR is separated by the surface layer from the first semiconductor layer in a direction towards the active region (AR), and
wherein each one of the enhanced doping regions extends from the first main side surface to a depth ($d_{EDR}$; $d_{EDR}'$) which is at least the depth ($d_{FFR}$) of the corresponding floating field ring.

2. The high power semiconductor device according to claim 1, wherein the average doping concentration of the surface layer is in a range between 10% and 50% of the minimum doping concentration of the bulk layer.

3. The high power semiconductor device according to claim 1, wherein the doping profile in a transition region at the interface between the surface layer and the bulk layer is step-like with a steep gradient of the doping concentration, which increases in the transition region by at least 100% from the surface layer to the bulk layer, wherein the transition region has a thickness of less than 0.1 μm.

4. The high power semiconductor device according to claim 1,
wherein the surface layer extends from the first main side surface to a depth ($d_{SL}$) which is at least the same as a depth ($d_{FFR}$) of the floating field rings.

5. The high power semiconductor device according to claim 1,
wherein the surface layer extends from the first main side surface to a depth ($d_{SL}$) which is more than the depth ($d_{FFR}$) of the floating field rings, so that the floating field rings are embedded in the surface layer.

6. The high power semiconductor device according to claim 1,
wherein the minimum doping concentration of the bulk layer is below $5 \cdot 10^{15}$ cm$^{-3}$.

7. The high power semiconductor device according to claim 1,
wherein the peak doping concentration of each one of the enhanced doping regions is in a range between $1 \cdot 10^{16}$ cm$^{-3}$ and $1 \cdot 10^{18}$ cm$^{-3}$.

8. The high power semiconductor device according to claim 1,
wherein each one of the enhanced doping regions envelops at least a part of a bottom surface of the corresponding floating field ring.

9. The high power semiconductor device according to claim 1,
wherein each one of the enhanced doping regions has a lateral width ($w_{EDR}$; $w_{EDR}''$) adjacent to the first main side surface, which is smaller than the lateral width ($w_{FFR}$) of a neighbouring floating field ring adjacent to the first main side surface and which is, for each one of the enhanced doping regions except an enhanced doping region next to the active region, smaller than the distance between this enhanced doping region and the next floating field region separated from this enhanced doping region by the surface layer in a direction towards the active region, and which is, for the enhanced doping region next to the active region, smaller than the distance between this enhanced doping region and the first semiconductor layer separated from this enhanced doping region by the surface layer in the direction towards the active region (AR).

10. The high power semiconductor device according to claim 1, comprising a plurality of extension regions, each extension region being formed as a third ring-shaped semiconductor region of the first conductivity type having a peak doping concentration lower than that of the floating field rings, each one of extension regions being formed on the lateral side of a corresponding floating ring to surround the corresponding floating field ring and to be in direct contact with the corresponding floating field ring, each one of the extension regions extending from the first main side surface to a depth ($d_{ER}$) which is deeper than the depth ($d_{FFR}$) of the corresponding floating field ring.

11. The high power semiconductor device according to claim 1, wherein the first to third semiconductor layers and the floating field rings are made of silicon carbide.

12. The high power semiconductor device according to claim 1,
wherein the surface layer separates the bulk layer from the first main side surface at least in an area between an innermost floating field ring and the active area and between each pair of neighbouring floating field rings.

13. The high power semiconductor device according to claim 1, wherein the average doping concentration of the surface layer is in a range between 20% and 40% of the minimum doping concentration of the bulk layer.

14. The high power semiconductor device according to claim 2, wherein the doping profile in a transition region at the interface between the surface layer and the bulk layer is step-like with a steep gradient of the doping concentration, which increases in the transition region by at least 100% from the surface layer to the bulk layer, wherein the transition region has a thickness of less than 0.1 μm.

15. The high power semiconductor device according to claim 13, wherein the doping profile in a transition region at the interface between the surface layer and the bulk layer is step-like with a steep gradient of the doping concentration, which increases in the transition region by at least 100% from the surface layer to the bulk layer, wherein the transition region has a thickness of less than 0.1 μm.

16. The high power semiconductor device according to claim 2, wherein the surface layer extends from the first main side surface to a depth ($d_{SL}$) which is at least the same as a depth ($d_{FFR}$) of the floating field rings.

17. The high power semiconductor device according to claim 3, wherein the surface layer extends from the first main side surface to a depth ($d_{SL}$) which is at least the same as a depth ($d_{FFR}$) of the floating field rings.

18. The high power semiconductor device according to claim 2, wherein the surface layer extends from the first main side surface to a depth ($d_{SL}$) which is more than the depth ($d_{FFR}$) of the floating field rings, so that the floating field rings are embedded in the surface layer.

19. The high power semiconductor device according to claim 3, wherein the surface layer extends from the first main side surface to a depth ($d_{SL}$) which is more than the depth ($d_{FFR}$) of the floating field rings, so that the floating field rings are embedded in the surface layer.

* * * * *